US 6,438,439 B1

(12) United States Patent
Barna et al.

(10) Patent No.: US 6,438,439 B1
(45) Date of Patent: Aug. 20, 2002

(54) EQUIPMENT EVALUATION AND DESIGN

(75) Inventors: Gabriel G. Barna, Richardson; Joseph C. Davis, Allen; Purnendu K. Mozumder, Plano; Richard G. Burch, McKinney, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/157,129

(22) Filed: Sep. 18, 1998

Related U.S. Application Data

(60) Provisional application No. 60/059,557, filed on Sep. 19, 1997, now abandoned.

(51) Int. Cl.[7] ............................................. G06F 19/00
(52) U.S. Cl. .................................... 700/121; 700/97
(58) Field of Search ........................ 700/97, 95, 108, 700/123, 121, 182; 703/1, 2, 6, 7; 716/2–9, 11, 13

(56) References Cited

U.S. PATENT DOCUMENTS

| | | | | |
|---|---|---|---|---|
| 5,377,116 A | * | 12/1994 | Wayne et al. | 700/174 |
| 5,544,066 A | * | 8/1996 | Rostoker et al. | 700/182 |
| 5,572,430 A | * | 11/1996 | Akasaka et al. | 700/97 |
| 5,587,914 A | * | 12/1996 | Conradson et al. | 700/173 |
| 5,598,344 A | * | 1/1997 | Dongelo et al. | 700/182 |
| 5,828,581 A | * | 10/1998 | Matumura | 700/121 |
| 5,838,595 A | * | 11/1998 | Sullivan et al. | 716/12 |
| 5,901,062 A | * | 5/1999 | Burch et al. | 345/334 |
| 6,092,217 A | * | 7/2000 | Kanekawa et al. | 714/11 |

* cited by examiner

Primary Examiner—Leo Picard
Assistant Examiner—Kidest Bahta
(74) Attorney, Agent, or Firm—Carlton H. Hoel; W. James Brady; Frederick J. Telecky, Jr.

(57) ABSTRACT

A semiconductor processing tool evaluation and design method which replaces tool specifications with a requirements region plus associated evaluation functions for iterative feedback tool design.

4 Claims, 7 Drawing Sheets

EQUIPMENT EVALUATION AND DESIGN

CROSS-REFERENCE TO RELATED APPLICATIONS

This application claims priority from provisional patent application Ser. No. 60/059,557, filed Sep. 19, 1997, now abandoned.

BACKGROUND

Design of equipment in the semiconductor industry (e.g., tools such as plasma etchers and CVD deposition reactors) typically begins with a customer's performance specification, such as a particular etch rate and uniformity for a particular material, and then applies experience plus physical models to create a design to meet this specification. Perturbations of the initial design follow if the initial design fails to meet the specification.

This approach has problems for the customer, including the all-to-often changes in the desired specification during or after the design work.

SUMMARY OF THE INVENTION

The present invention provides a design and evaluation method which replaces the tool specification with a requirements region plus associated evaluation functions defined on the requirements region; the evaluation method employs the evaluation functions and the design method uses the evaluation in an iterative feedback design.

This has advantages including an evaluation and design which accommodates specification changes.

BRIEF DESCRIPTION THE DRAWINGS

Figure 3A:
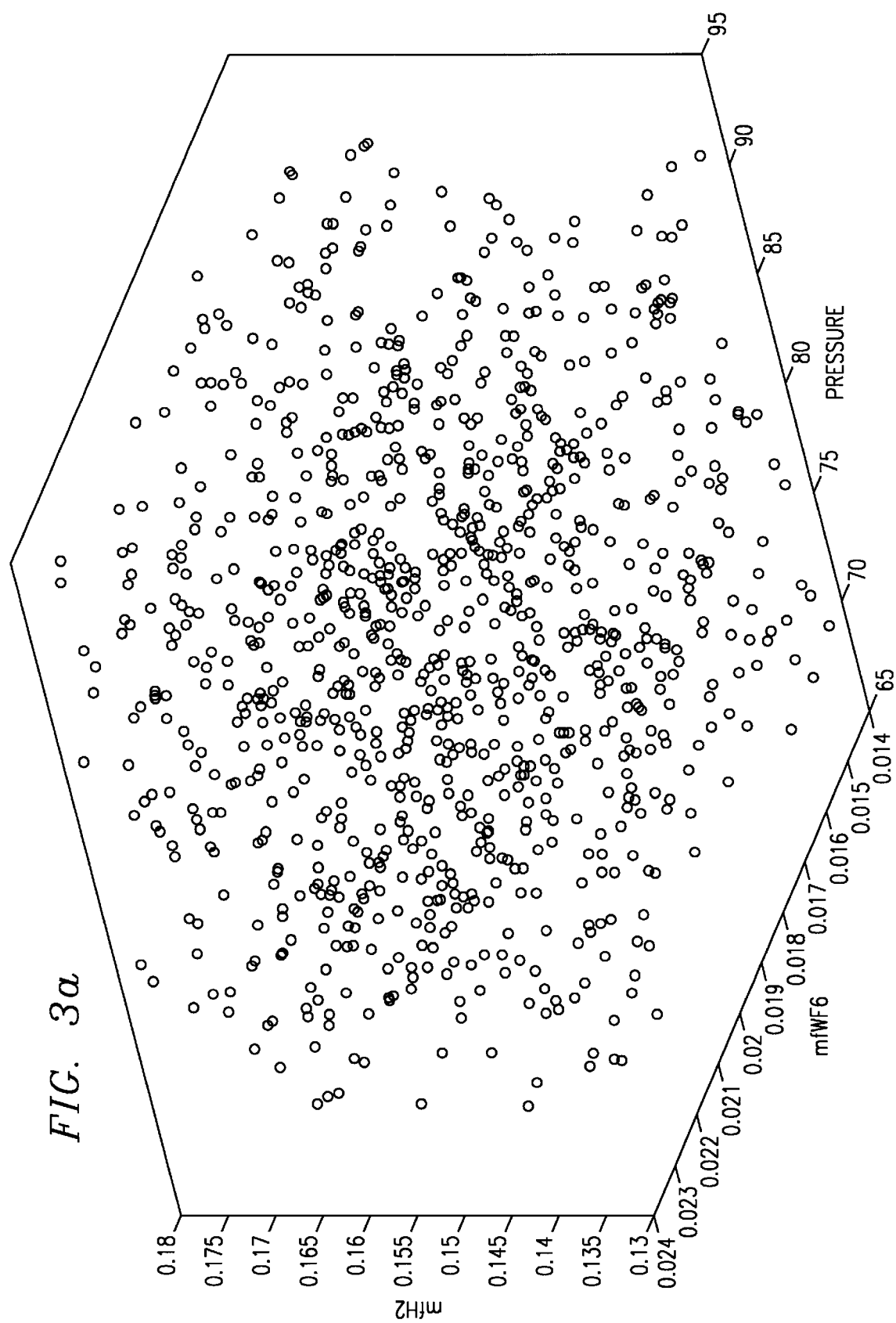
Figure 3B:
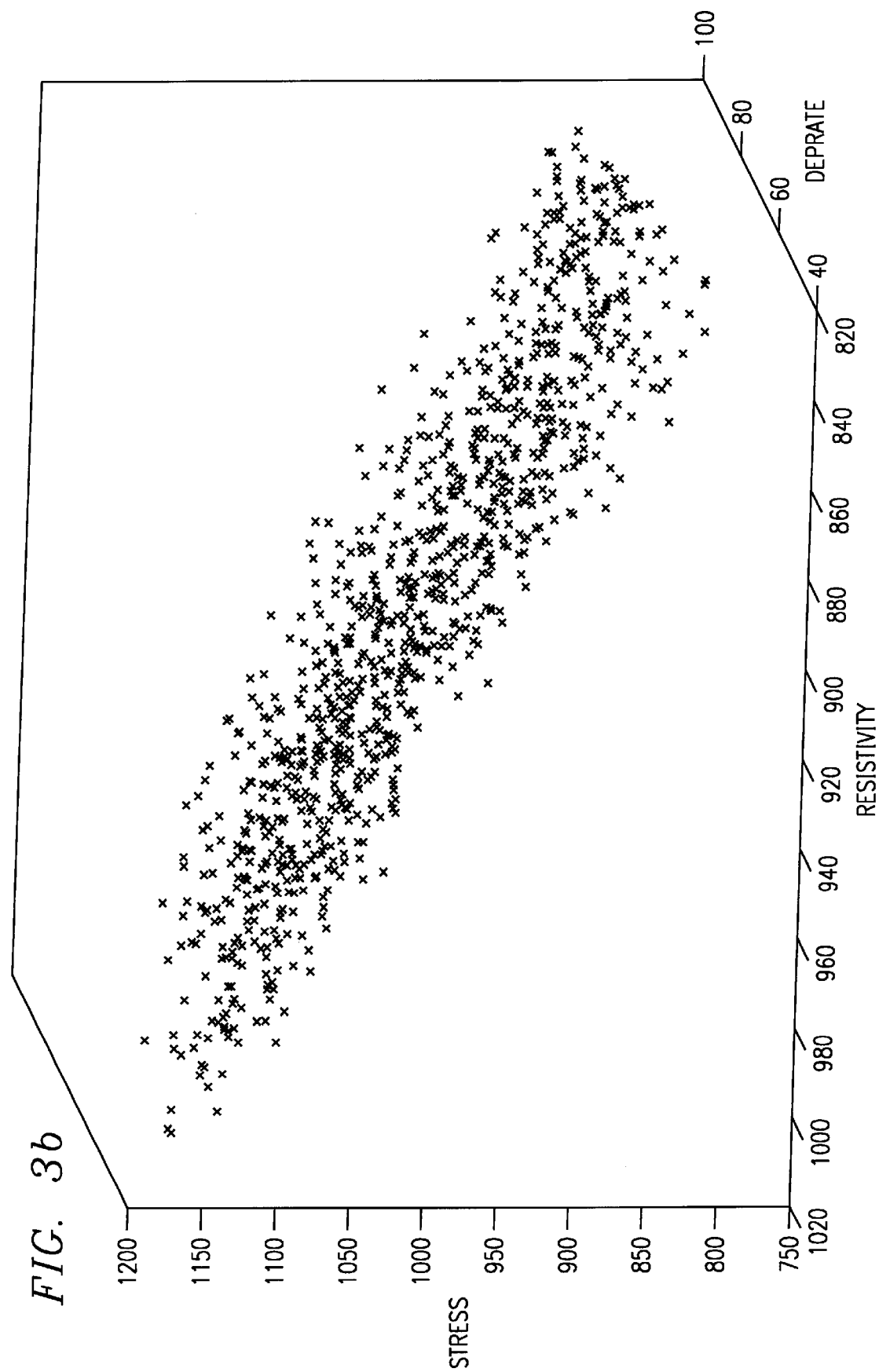

FIGS. 3a–b shows response surface determination.

Figure 4A:
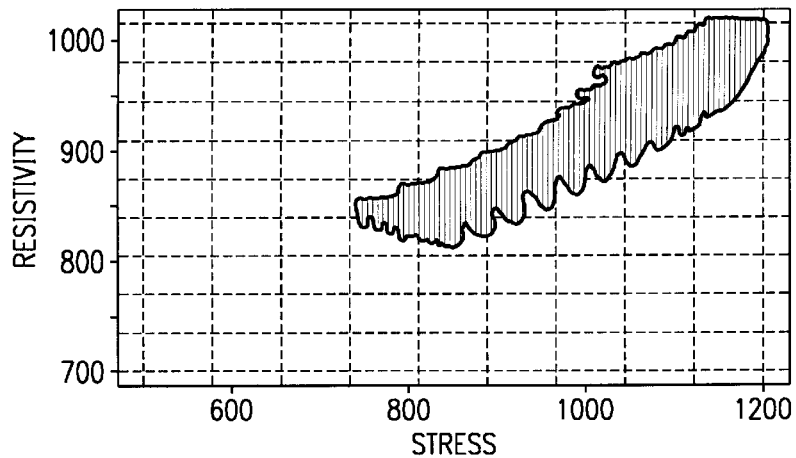
Figure 4B:
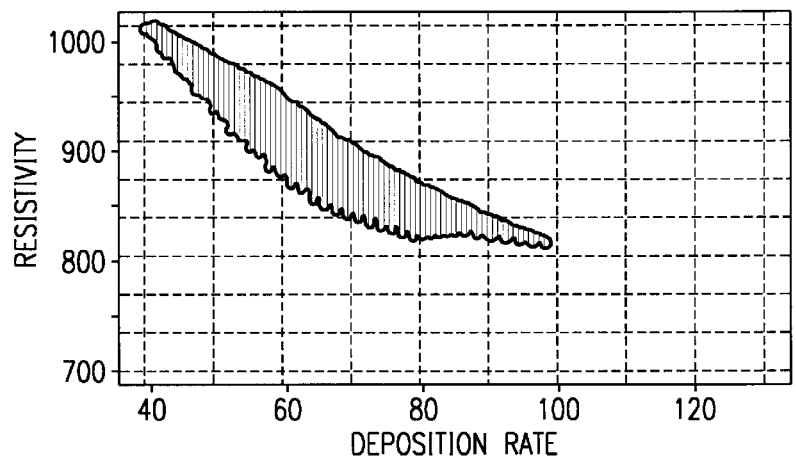
Figure 4C:
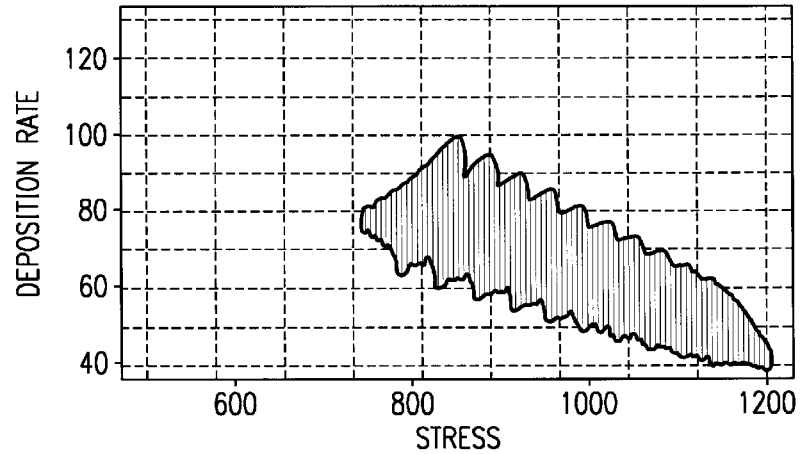

FIGS. 4a–c are projects of the surface of FIG. 3b.

Figure 5A:
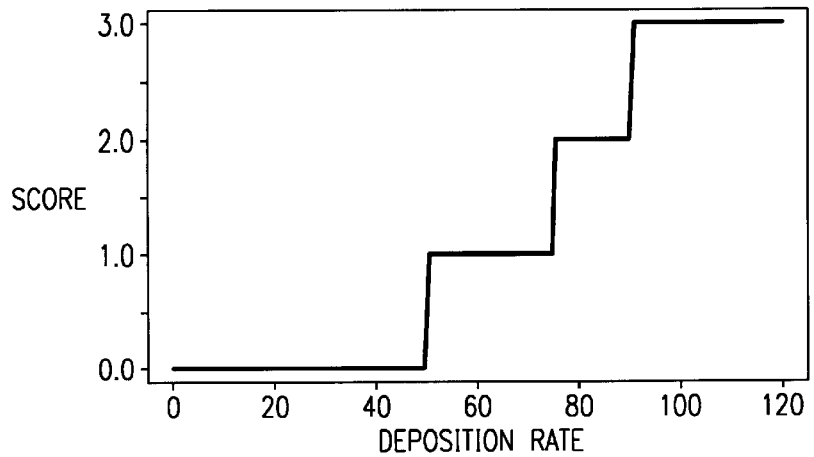
Figure 5B:
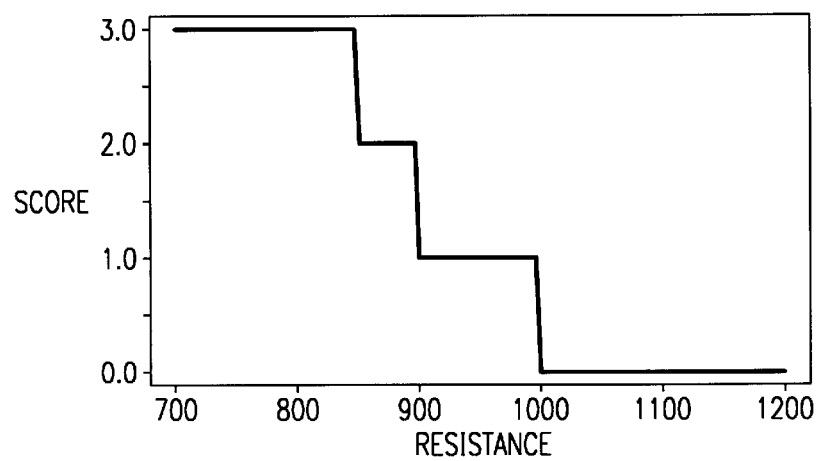
Figure 5C:
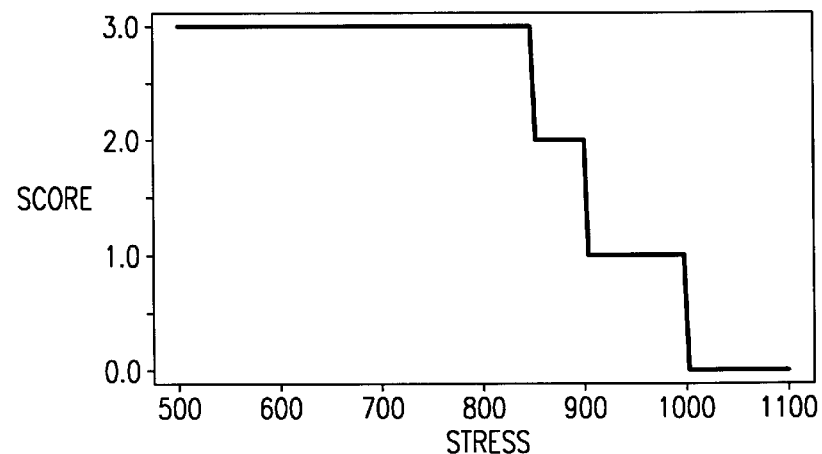

FIGS. 5a–c illustrate evaluation functions.

Figure 6:
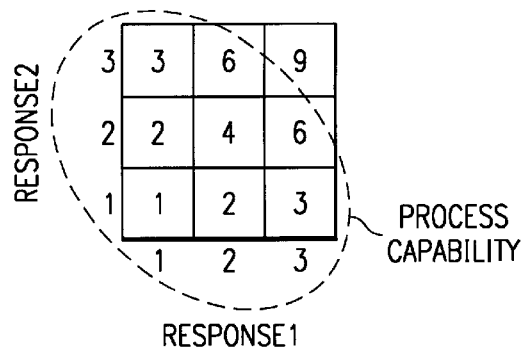

FIG. 6 shows intersection in response space.

Figure 7:
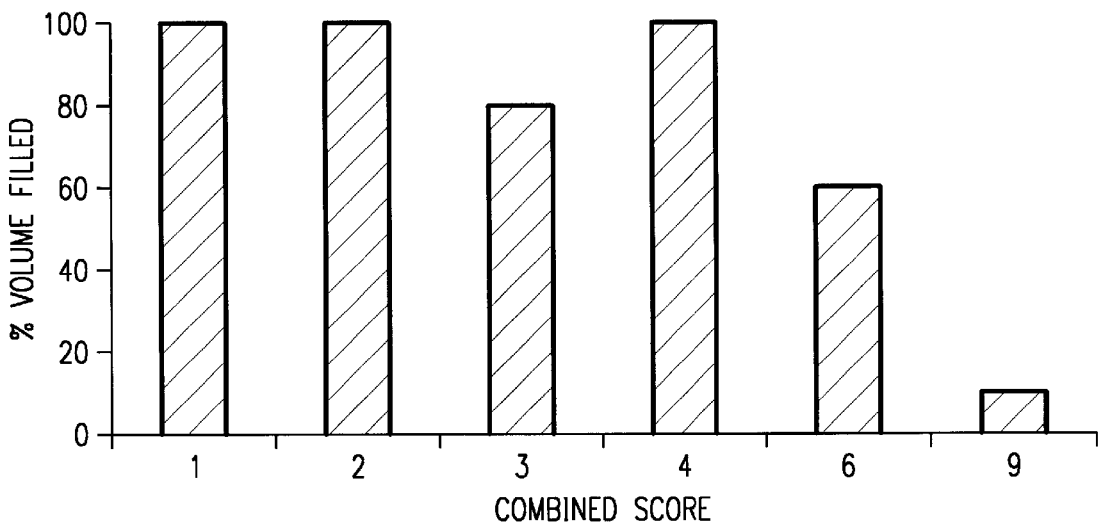
Figure 8:
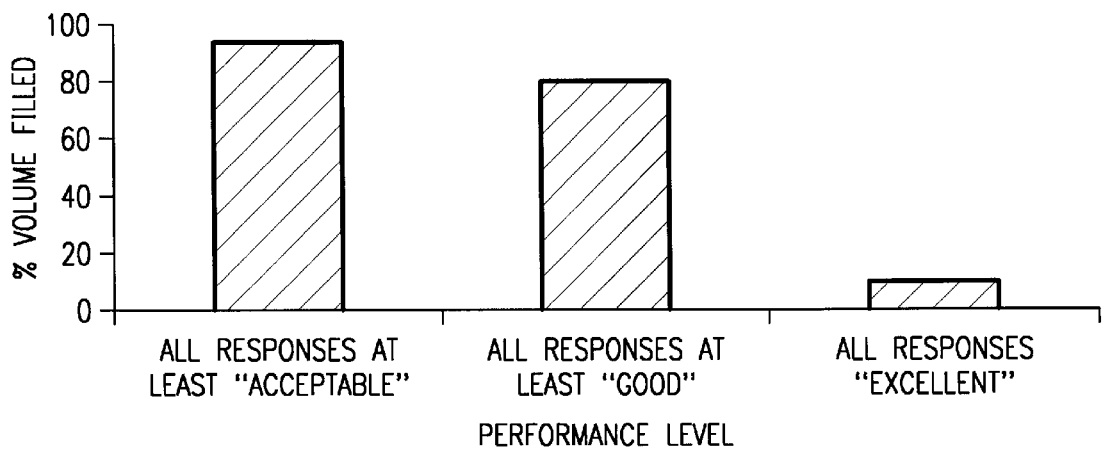

FIGS. 7–8 are evaluation results.

Figure 9:
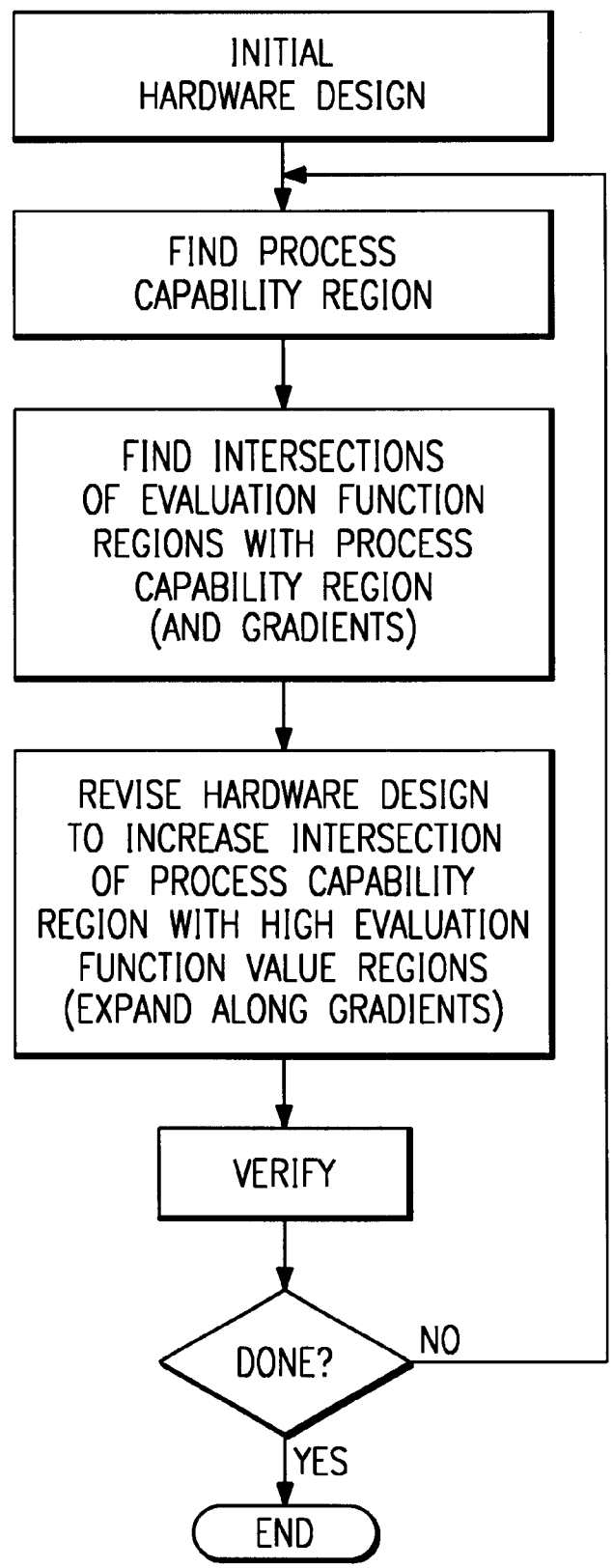

FIG. 9 is a design process flow.

DESCRIPTION OF THE PREFERRED EMBODIMENTS

Overview

Tool performance is defined as the intersection in the multidimensional response space between the tool's process capability, determined from process characterization experiments, and the customer's range of requirements for those processes. Specification of the tool performance for the dependent variables of a given process (e.g., deposition rate, uniformity, conformality) will be both for the short-term requirements from the tool (i.e., for the current technology) and for the anticipated requirements for the upcoming technologies.

Figure 1:
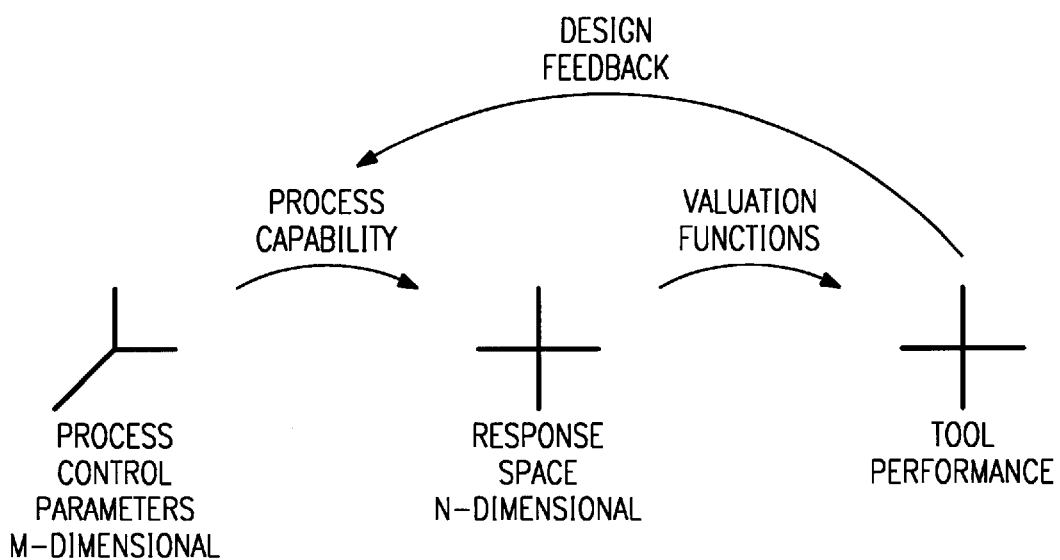
FIG. 1 illustrates the preferred embodiment design flow.

The preferred embodiment evaluation method of a tool uses evaluation functions defined in the response space, and the preferred embodiment design method uses the evaluation method to adjust physical structure. FIG. 1 heuristically illustrates the methods.

Evaluation Preferred Embodiment

Figure 2:
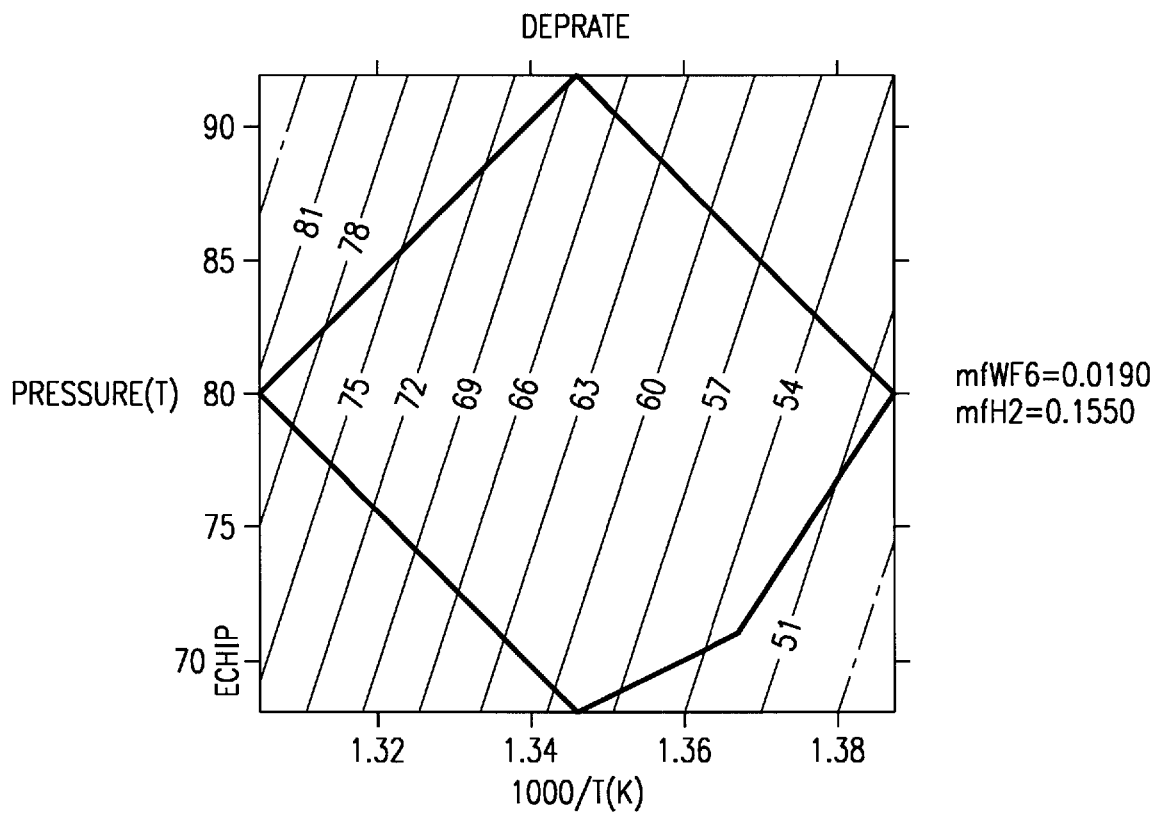
FIG. 2 shows a response surface projection.

Process characterization is a systematic design of experiment (DOE) approach culminating in a Response Surface for each dependent variable of interest. If the tool and process are in a very early development phase, process characterization is performed by first running a screening experiment (possibly a series of screening experiments), where the significant control parameters (such as RF power, gas flows, pressure, . . . ) are identified and the range of responses is adjusted to the region of interest. If the process is better characterized or understood, the screening experiment can be ignored and a set of experiments can be run directly to provide a polynomial model for each of the dependent variables in terms of the independent control parameters. Standard response surface plots then provide a view of the values and trends of the individual responses, within the range of the control parameters employed in the design. FIG. 2 shows an example of such a response surface (level lines) for the deposition rate (dependent variable) of a chemical vapor deposition (CVD) tungsten deposition in terms of the pressure and temperature (process control parameters) with constant flows of WF6 and H2 (independent control parameters). That is, the dependent variable deposition rate is a function of the four independent control parameters temperature, pressure, WF6 mass flow, and H2 mass flow; and about a particular specified point this function can be approximated by a polynomial (e.g., Taylor series expansion).

Process capability of a tool is defined the portion of the combined response space (the space of dependent variables) filled by the processes available from the tool in the original design space (independent control parameter space). Process capability is obtained by starting with the polynomial model generated in the process characterization work: a simulation of a large number of experiments run within the original design space then generate the combination of responses that are available. For example, the tungsten deposition characterized with four independent control parameters pressure, temperature, WF6 flow, and H2 flow (four dimensional design space) may have three dependent variables: deposition rate, stress of deposited tungsten, and resistivity of the deposited tungsten. (three dimensional combined response space). FIG. 3a shows the large number of control parameter space points and FIG. 3b shows the corresponding dependent variable points in response space. Additionally, FIGS. 4a–c show two-dimensional projections of the process capability region of FIG. 3b. The question is not whether one was effective in finding a process that provides a particular set of responses; but whether that set of responses is available within the original design space include in the modeling for process characterization.

In this paradigm of defining a tool performance, the next step is to define a range of process requirements. For the sake of simplicity, these requirements will for now be defined in a "box" configuration, with a high/low value for each response. At a later time, a more complex configuration might be used. Since this entire paradigm is aimed at understanding and quantifying the process capability of the tool, a key concept is to evaluate the tool against current requirements and those for the upcoming technologies expected to be processed on this tool. Hence, the high/low requirements are provided for Current Technology and Future Technology. These two sets of requirements have to be considered at the process characterization stage, where they may, or may not, require different design spaces.

The N-dimensional response space (space of dependent variables) contains a region representing the process capability of the tool (illustrated in FIG. 3b) and a region representing the range of requirements; that is, the combinations of dependent variable values which are desired. Thus the intersection of these two regions represents requirements which are actually obtainable. Hence, a larger intersection volume would suggest a more desirable tool.

In fact, the requirements are not a yes-no decisions; rather, the value of a requirement varies continuously over any range. For example, if tungsten stress is x, then a function such as $10^6-x^2$ could be used to value the stress variable; this means the value is negative in the upper portion of the process capability points in FIG. 3b and becomes increasingly positive towards the lower portion. The range of requirements could simply only include points where the stress valuation is positive.

Similarly, the deposition rate could have a valuation function and the resistivity could have a valuation function, and these function similarly define boundaries of the range of requirements by the condition that the valuation functions be positive. Indeed, for purposes of example, consider the three discrete valuation functions for deposition rate, resistivity, and stress shown in FIGS. 5a–c, respectively. These valuation functions could be combined into a single overall valuation function by, for example, taking the product of the valuation functions or the geometric mean or the average or the root-mean-square and so forth. Of course, the general case would be a single valuation function of the three variables.

Continuing the tungsten deposition example, the three dimensional response space of tungsten resistivity, deposition rate, and stress can be taken as composed of a set of rectangular solids corresponding to the ranges of the requirements variables in which the valuation functions of FIGS. 5a–c are constant. Then the process capability region intersects these rectangular solids, and the tool performance can be expressed in the intersection volume in each requirements rectangular solid. In particular, FIG. 6 illustrates a simplification with only two requirements variables, the rectangular solids now squares, and a product of the two valuation functions. Thus, the upper righthand square has a value of 9 because both valuation functions have values of 3 in the square. However, only a small part of this square intersects the process capability region. In contrast, the squares with values of 6 (one valuation function value of 2 and the other of value 3) are roughly half covered by the process capability region, and the other squares fully covered. This performance can be expressed as percent of the squares of a given value covered by the process capability region; see FIG. 7. Alternatively, the percent of the squares with both valuation functions of value of at least 1 ("acceptable") or both at least 2 ("good") or both at least 3 ("excellent") may be used; see FIG. 8.

This analysis may be performed with the PSDesigner software, which requires an input of:

1. the data from the process characterization model
2. scoring the individual responses (evaluation function)
3. evaluating the intersection volume between the scored requirements and the process capability
4. combining the scores and binning into performance levels FIGS. 7–8 Illustrate the example results Tool Design Preferred Embodiment The equipment (tool) design preferred embodiment uses the evaluation of an existing or prototype tool as feedback information for changes in the design; and the evaluation function directs the changes.

The evaluation functions may change in successive process generations for various reasons. For example, if tungsten films will be thinner, then deposition rate will be less important because less tungsten needs to be deposited. Similarly, stress may be allowed to increase again because the film is thinner and less of a mechanical problem. Contrarily, the resistivity may need to be lower again because thinner films implies increased resistance.

A single valuation function may be applicable for two or more process generations simply because the valuation threshold for acceptance of a tool can be increased in successive generations. For example, if tungsten stress were to be lowered in succeeding process generations and the valuation function were $10^6-x^2$, then the range of requirements boundary could be change from the valuation being positive to the valuation being greater than a threshold such as 105. In essence, the (combined) valuation function provides a nested sequence of ranges of requirements with successive ranges having greater desirabilities. The volume and shape of the intersections of the process capability region with a range of requirements indicates the ability of the tool to satisfy changing specifications.

If the inverse images of the ranges of requirements in the process control parameter space are considered, then the robustness of any operating specification can be assessed by the distance in the inverse image from the operating point to the inverse image boundary.

Preferred Embodiment Hardware Design

The preferred embodiment hardware design method begins with an initial hardware design, which may be an existing tool or prototype or simulation and proceeds as follows.

(1) Apply the steps of the evaluation preferred embodiment to the initial hardware design. This gives a requirements range (valuation functions) and the process capability of the initial design; of course, the valuation functions used are to reflect both the current and likely future requirements which the design aims to fulfill. From this evaluation, locate the portion of the process capability region which intersects with the portion of the requirements region having the highest valuation function values which give a nonempty intersection. For example, this would be the portion in the upper righthand square of FIG. 6. This response space region corresponds to a "high valuation" region in the process control parameter space of this initial design. Optionally, also determine the directions of increasing evaluation functions in the response space about this intersection and the corresponding directions in the process control parameter space about the high valuation region. For a differentiable evaluation function (or an evaluation function with a differentiable approximation), this simply is the gradient, and for a discrete evaluation function such as in FIG. 6, the gradient could be a difference operation analogous to the Sobel operations in image analysis. With the simple evaluation function of FIG. 6, the gradients point to the upper righthand corner; of course, finer resolution in the evaluation function yields finer resolution in the gradient direction. These directions may help in the making the change of following step (2).

(2) Use the location of this high valuation region (and directions) in the process control parameter space plus any physical models to change the initial hardware design to a first iteration hardware design which has a process capability region with a larger intersection with the highest nonempty value regions of the evaluation function (extends beyond that of the initial design in the gradient directions). For the example of FIG. 6 the iteration design would expand the process capability region further into the upper righthand square of value 9.

(3) Use the evaluation preferred embodiment to verify that the first iteration hardware design actually provides larger regions of high valuation function values and/or regions with higher valuation function values than the original design. Indeed, for the example of FIG. 6, it is possible that the iteration design process capability region slightly expands into the square with value 9 but also radically decreases the intersection with the squares of value 6. In this case the overall evaluation may not be considered higher than for the initial design. The first iteration hardware design may be actually built and process capability experiments performed or simulated as described in the foregoing.

(4) Further iterations of the hardware design may be performed by repeating the foregoing steps with the first iteration design in place of the original design to generate a second (and more) iteration designs. FIG. 9 illustrates the hardware design flow.

What is claimed is:

1. A method of manufacturing tool evaluation, comprising the steps of:
   (a) providing a region of possible outputs for a manufacturing tool, said region in an output variable space;
   (b) providing an evaluation function defined in said output variable space; and
   (c) computing values of said evaluation function for points in said region of possible outputs.

2. The method of claim 1, wherein:
   (a) said evaluation function is the product of first and second evaluation functions with said first and second evaluation functions dependent upon different sets of variables.

3. A method of manufacturing tool design, comprising the steps of:
   (a) providing an initial manufacturing tool design;
   (b) determining an initial region of possible outputs for said initial manufacturing tool design in an output variable space;
   (c) providing an evaluation function defined in said output variable space;
   (d) computing values of said evaluation function for points in said initial region of possible outputs;
   (e) changing said initial manufacturing tool design to a second manufacturing tool design;
   (f) determining a second region of possible outputs of said second manufacturing tool design in said output variable space;
   (g) computing values of said evaluation function for points in said second region of possible outputs; and
   (h) comparing said initial manufactruign tool design with said second manufacturing tool design by comparing said values computed in foregoing step (d) with said values computed in foregoing step (g).

4. The method of claim 3, wherein:
   (a) said evaluation function is the product of first and second evaluation functions with said first and second evaluation functions dependent upon different sets of variables.

* * * * *